(12) United States Patent
You et al.

(10) Patent No.: US 9,461,263 B2
(45) Date of Patent: Oct. 4, 2016

(54) ORGANIC LIGHT EMITTING DISPLAY APPARATUS AND METHOD OF MANUFACTURING THE SAME

(71) Applicants: Chun-Gi You, Yongin (KR); Joon-Hoo Choi, Yongin (KR); Jong-Hyun Park, Yongin (KR); Kyung-Hoon Park, Yongin (KR); Jeong-Hwan Kim, Yongin (KR); Seong-Kweon Heo, Yongin (KR)

(72) Inventors: Chun-Gi You, Yongin (KR); Joon-Hoo Choi, Yongin (KR); Jong-Hyun Park, Yongin (KR); Kyung-Hoon Park, Yongin (KR); Jeong-Hwan Kim, Yongin (KR); Seong-Kweon Heo, Yongin (KR)

(73) Assignee: SAMSUNG DISPLAY CO., LTD., Yongin, Gyunggi-do (KR)

( * ) Notice: Subject to any disclaimer, the term of this patent is extended or adjusted under 35 U.S.C. 154(b) by 8 days.

(21) Appl. No.: 13/676,707

(22) Filed: Nov. 14, 2012

(65) Prior Publication Data
US 2013/0292651 A1 Nov. 7, 2013

(30) Foreign Application Priority Data
May 3, 2012 (KR) .................. 10-2012-0047121

(51) Int. Cl.
 *H01L 27/32* (2006.01)
 *H01L 51/50* (2006.01)
 *H01L 51/52* (2006.01)

(52) U.S. Cl.
 CPC ......... *H01L 51/5092* (2013.01); *H01L 27/326* (2013.01); *H01L 27/3248* (2013.01); *H01L 51/5206* (2013.01); *H01L 51/5212* (2013.01); *H01L 27/3265* (2013.01); *H01L 2251/5392* (2013.01)

(58) Field of Classification Search
 CPC .......... H01L 27/3248; H01L 27/326–27/3265

USPC ........................ 257/E51.001, 40; 438/99, 46
 See application file for complete search history.

(56) References Cited

U.S. PATENT DOCUMENTS

| 7,022,591 B2 * | 4/2006 | Chang .......................... 438/482 |
| 7,132,716 B2 * | 11/2006 | Moon et al. .................. 257/347 |
| 2005/0161680 A1 | 7/2005 | Kawakami et al. |
| 2006/0238115 A1 * | 10/2006 | Lee et al. ...................... 313/504 |
| 2011/0042678 A1 * | 2/2011 | Kim et al. ....................... 257/72 |
| 2011/0062434 A1 * | 3/2011 | Eguchi et al. .................. 257/43 |
| 2011/0108848 A1 | 5/2011 | Lee et al. |

(Continued)

FOREIGN PATENT DOCUMENTS

| CN | 100372099 C | 2/2008 |
| CN | 102117826 A | 7/2011 |

(Continued)

OTHER PUBLICATIONS

Taiwanese Office Action dated Jul. 11, 2016 for corresponding Taiwan Patent Application No. 101139158; Chun-Gi You, et al.

*Primary Examiner* — Thao X Le
*Assistant Examiner* — J. R. Oakley
(74) *Attorney, Agent, or Firm* — Lee & Morse, P.C.

(57) ABSTRACT

The organic light emitting display apparatus includes a substrate; a buffer film on the substrate, the buffer film including a via hole, a thin film transistor (TFT) on the buffer film, the TFT including an active layer, a gate electrode, a source electrode, and a drain electrode, a first electrode electrically connected to one of the source electrode and the drain electrode and corresponding to the via hole; an intermediate layer on the first electrode, the intermediate layer including an organic emission layer, and a second electrode on the intermediate layer.

13 Claims, 11 Drawing Sheets

(56) References Cited

U.S. PATENT DOCUMENTS

| | | | |
|---|---|---|---|
| 2011/0127499 A1* | 6/2011 | Yoon et al. | 257/40 |
| 2011/0204369 A1* | 8/2011 | Ha et al. | 257/59 |
| 2011/0260605 A1* | 10/2011 | Adachi et al. | 313/506 |
| 2012/0032207 A1* | 2/2012 | Nishiyama et al. | 257/89 |
| 2012/0097952 A1* | 4/2012 | Kang et al. | 257/59 |
| 2012/0168761 A1* | 7/2012 | Park et al. | 257/59 |
| 2013/0069107 A1* | 3/2013 | Nozaki et al. | 257/103 |

FOREIGN PATENT DOCUMENTS

| | | | | |
|---|---|---|---|---|
| KR | 10-2004-0000629 A | | 1/2004 | |
| KR | 1020040000629 | * | 1/2004 | ............. H04B 33/22 |
| KR | 10-2004-0037889 A | | 5/2004 | |
| KR | 10-2006-0028251 A | | 3/2006 | |
| KR | 10-2007-0068092 A | | 6/2007 | |
| KR | 101189137 | * | 6/2007 | ............. H05B 33/10 |

* cited by examiner

ORGANIC LIGHT EMITTING DISPLAY APPARATUS AND METHOD OF MANUFACTURING THE SAME

CROSS-REFERENCE TO RELATED PATENT APPLICATION

This application claims the benefit under 35 U.S.C. §119 of Korean Patent Application No. 10-2012-0047121, filed on May 3, 2012, in the Korean Intellectual Property Office, the disclosure of which is incorporated herein in its entirety by reference.

BACKGROUND

1. Field of the Invention

Embodiments relate to an organic light emitting display apparatus, and a method of manufacturing the same.

2. Description of the Related Art

Recently, display apparatuses have been replaced with portable thin film flat panel display apparatuses. An organic light emitting display apparatus is a self-emitting display apparatus that has a large viewing angle, improved contrast characteristics, and a fast response speed. Thus, the organic light emitting display apparatus has drawn attention as a next-generation display apparatus.

An organic light-emitting display apparatus includes an intermediate layer, a first electrode, and a second electrode. The intermediate layer includes an organic emission layer. When a voltage is applied to the first and second electrodes, visible light is emitted from the organic emission layer.

SUMMARY

Embodiments are directed to an organic light emitting display apparatus including a substrate, a buffer film on the substrate, the buffer film including a via hole, a thin film transistor (TFT) on the buffer film, the TFT including an active layer, a gate electrode, a source electrode, and a drain electrode, a first electrode electrically connected to one of the source electrode and the drain electrode and corresponding to the via hole, an intermediate layer on the first electrode, the intermediate layer including an organic emission layer, and a second electrode on the intermediate layer.

The organic light emitting display apparatus may further include a gate insulating film disposed to insulate the gate electrode and the active layer from each other. The first electrode may be on the gate insulating film. The gate insulating film may fill the via hole. The via hole may be larger than the first electrode.

The first electrode may contain indium tin oxide (ITO), indium zinc oxide (IZO), zinc oxide (ZnO), indium oxide ($In_2O_3$), indium gallium oxide (IGO), or aluminum zinc oxide (AZO).

The first electrode may be on a layer on which the gate electrode is disposed, and may contain at least one material selected from among materials forming the gate electrode.

The gate electrode may include a first conductive layer and a second conductive layer, the second conductive layer being on the first conductive layer. The first electrode may be on a layer on which the first conductive layer is disposed. The first electrode may include a same material as the first conductive layer.

The intermediate layer may be disposed apart from the TFT to not overlap with the TFT.

The organic light emitting display apparatus may further include a capacitor including a first capacitor electrode on a layer on which the active layer is disposed, and a second capacitor electrode on a layer on which the gate electrode is disposed.

Embodiments are also directed to a method of manufacturing an organic light emitting display apparatus, the method including forming a buffer film on a substrate to include a via hole, forming a thin film transistor (TFT) on the buffer film, the TFT including an active layer, a gate electrode, a source electrode, and a drain electrode, forming a first electrode to be electrically connected to one of the source electrode and the drain electrode and to correspond to the via hole, forming an intermediate layer on the first electrode, the intermediate layer including an organic emission layer, and forming a second electrode on the intermediate layer.

The buffer film and the active layer may be formed according to a patterning process using a halftone mask.

The forming of the buffer film may include forming a buffer film material layer on the substrate, forming the active layer on the buffer film material layer, forming an etch mask to cover the active layer and to not cover a region in which the via hole is to be formed, and forming the via hole by performing an etch process by using the etch mask.

The method may further include performing an ashing process after the etch process is performed, the ashing process being performed before the etch mask is removed.

The forming of the active layer may include at least a crystallization process.

The method may further include forming a gate insulating film between the gate electrode and the active layer, and forming the first electrode on the gate insulating film.

The gate insulating film may be formed to fill the via hole.

The via hole may be larger than the first electrode.

BRIEF DESCRIPTION OF THE DRAWINGS

Features will become apparent by describing in detail exemplary embodiments thereof with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope thereof to those skilled in the art.

As used herein, expressions such as "at least one of," when preceding a list of elements, modify the entire list of elements and do not modify the individual elements of the list.

Figure 1:
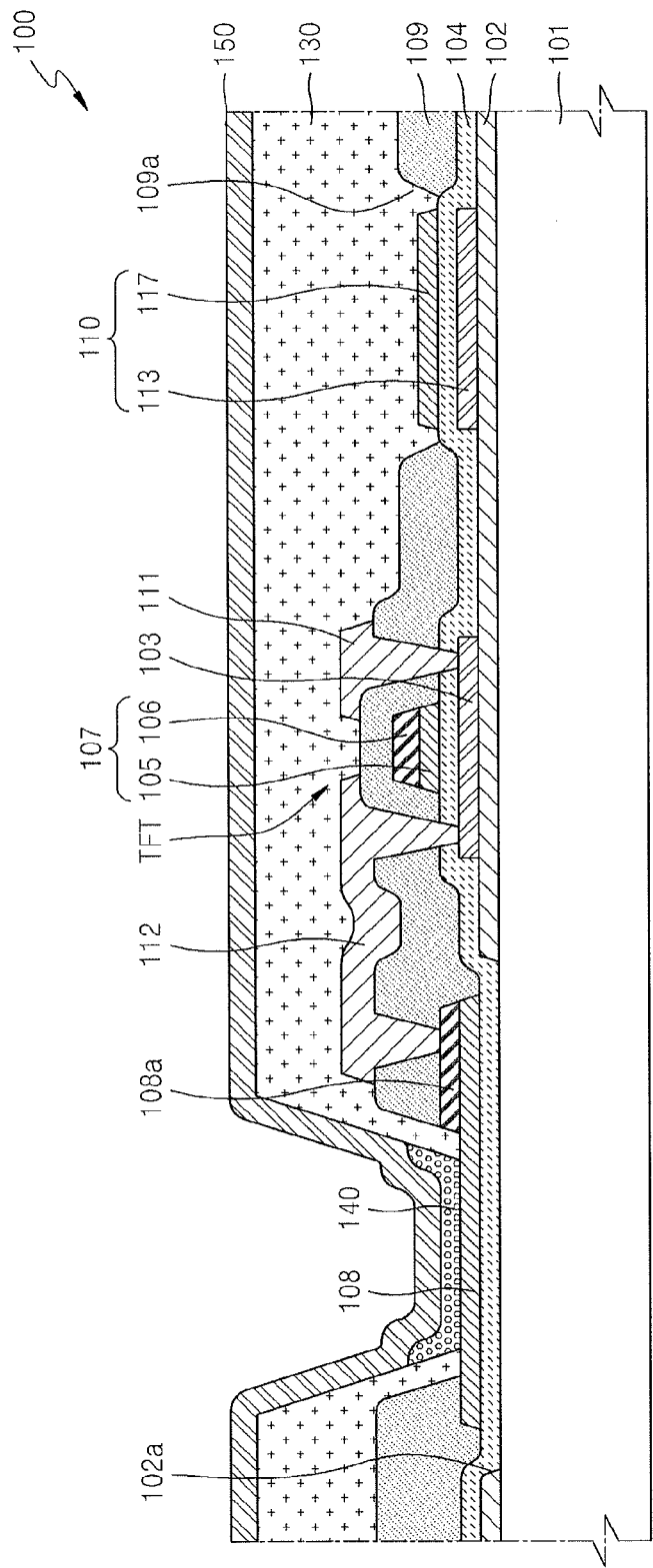
FIG. 1 is a schematic cross-sectional view of an organic light emitting display apparatus according to an embodiment.

FIG. 1 is a schematic cross-sectional view of an organic light emitting display apparatus 100 according to an embodiment. Referring to FIG. 1, the organic light emitting display apparatus 100 includes a substrate 101, a buffer film 102, a first electrode 108, a thin film transistor (TFT), an intermediate layer 140, a second electrode 150, and a capacitor 110.

The TFT includes an active layer 103, a gate electrode 107, a source electrode 111, and a drain electrode 112.

The capacitor 110 includes a first capacitor electrode 113 and a second capacitor electrode 117.

The elements of the organic light emitting display apparatus 100 are described in detail below.

The substrate 101 may be formed of any suitable material such as a $SiO_2$-based transparent glass material, or a transparent plastic material. The transparent plastic material may include at least one material selected from among various organic materials.

The buffer film 102 is formed on the substrate 101. The buffer film 102 provides a flat surface on the substrate 101 and protects the substrate 101 against moisture and foreign substances. The buffer film 102 may be formed of any of various materials for providing such functions. For example, the buffer film 102 may contain an inorganic material, e.g., a silicon oxide, a silicon nitride, a silicon oxynitride, an aluminum oxide, an aluminum nitride, a titanium oxide, or a titanium nitride; an organic material, e.g., polyimide, polyester, or acryl, or a stacked structure including at least one from among these materials.

The buffer film 102 includes a via hole 102*a*. A predetermined region of the substrate 101 is not covered by the buffer film 102 due to the via hole 102*a*. The buffer film 102 has a predetermined thickness, and the via hole 102*a* has a side surface corresponding to the thickness of the buffer film 102.

The active layer 103 and the first capacitor electrode 113 are formed on the buffer film 102. The active layer 103 and the first capacitor electrode 113 may be formed of the same material. The active layer 103 and the first capacitor electrode 113 may contain a semiconductor material, e.g., a silicon material.

A gate insulating film 104 is formed on the buffer film 102 to cover the active layer 103 and the first capacitor electrode 113. In this case, the gate insulating film 104 is disposed to fill the via hole 102*a* of the buffer film 102.

The gate electrode 107, the first electrode 108 and the second capacitor electrode 117 are formed on the gate insulating film 104.

The gate electrode 107 includes a first conductive layer 105 and a second conductive layer 106. The first conductive layer 105 contains a transmissive conductive material, e.g., indium tin oxide (ITO), indium zinc oxide (IZO), zinc oxide (ZnO), indium oxide ($In_2O_3$), indium gallium oxide (IGO), or aluminum zinc oxide (AZO).

The second conductive layer 106 may be formed on the first conductive layer 105 to contain metal or an alloy, e.g., molybdenum (Mo), tungsten molybdenum (MoW), or an aluminum (Al)-based alloy, as examples. For example, the second conductive layer 106 may have a stacked structure of molybdenum (Mo), aluminum (Al), and molybdenum (Mo).

The first electrode 108 contains a transmissive conductive material, e.g., the transmissive conductive material used to form the first conductive layer 105. A conductive portion 108*a* is disposed on an upper region of the first electrode 108. The conductive portion 108*a* may be formed of the material used to form the second conductive layer 106.

The first electrode 108 is formed to correspond to the via hole 102*a* of the buffer film 102. Specifically, the via hole 102*a* may be larger than the first electrode 108.

The second capacitor electrode 117 may be formed of the material used to form the first conductive layer 105.

Although FIG. 1 illustrates that the second capacitor electrode 117 has a single-layered structure, the present invention is not limited thereto. The second capacitor electrode 117 may have a multi-layered structure, similar to the gate electrode 107.

An interlayer insulating layer 109 is formed on the first electrode 108, the gate electrode 107, and the second capacitor electrode 117. The interlayer insulating layer 109 may contain any of various insulating materials, e.g., an organic material and an inorganic material. In this case, the interlayer insulating layer 109 is formed not to cover at least one upper region of the second capacitor electrode 117. In detail, the interlayer insulating layer 109 may include an aperture 109*a* corresponding to the second capacitor electrode 117.

The interlayer insulating layer 109 is also formed not to cover at least one upper region of the first electrode 108.

The source electrode 111 and the drain electrode 112 are formed on the interlayer insulating layer 109. The source electrode 111 and the drain electrode 112 are connected to the active layer 103. The source electrode 111 and the drain electrode 112 may be formed of any of various conductive materials, e.g., at least one metal selected from the group consisting of gold (Au), palladium (Pd), platinum (Pt), nickel (Ni), rhodium (Rh), ruthenium (Ru), iridium (Ir), osmium (Os), aluminum (Al), molybdenum (Mo), neodymium (Nd), and tungsten (W).

One of the source electrode 111 and the drain electrode 112 is electrically connected to the first electrode 108. Referring to FIG. 1, the drain electrode 112 is electrically connected to the first electrode 108. Specifically, the drain electrode 112 contacts the conductive portion 108*a* and is thus electrically connected to the first electrode 108.

A pixel defining film 130 is formed on the interlayer insulating layer 109 to cover the source electrode 111, the drain electrode 112, and the second capacitor electrode 117. The pixel defining film 130 is formed not to cover at least one upper region of the first electrode 108.

The intermediate layer 140 is formed on the first electrode 108. In detail, the intermediate layer 140 is formed to contact the at least one upper region of the first electrode 108 that is not covered with the pixel defining film 130.

The intermediate layer 140 includes an organic emission layer to emit visible light.

The intermediate layer 140 may be formed of a low-molecular weight organic film or a high-molecular weight organic film. If the organic emission layer of the intermediate layer 140 is formed of a low-molecular weight organic film, then the intermediate layer 140 may include a hole injection layer (HIL), a hole transport layer (HTL), the organic emission layer, an electron transport layer (ETL), an electron injection layer (EIL), and the like.

The HIL may be formed of a phthalocyanine compound, e.g., copper phthalocyanine (CuPc), or a starburst amine, e.g., TCTA, m-MTDATA, or m-MTDAPB.

The HTL may be formed of N,N-bis(3-methylphenyl)-N, N-diphenyl-[1,1-biphenyl]-4,4'-diamine (TPD), N,N'-di (naphthalene-1-yl)-N,N-diphenyl-benzidine (α-NPD), or the like.

The ETL may be formed of LiF, NaCl, CsF, $Li_2O$, BaO, Liq, or the like.

The ETL may be formed of tris(8-hydroxy-quinolinato) aluminum (Alq3).

The organic emission layer may include a host material and a dopant material.

Examples of the host material may include tris(8-hydroxy-quinolinato) aluminum (Alq3), 9,10-di(naphth-2-yl) anthracene (AND), 3-tert-butyl-9,10-di(naphth-2-yl) anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-Spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), or the like.

Examples of the dopant material may include 4,4'-bis[4-(di-p-tolylamino)styryl]biphenyl (DPAVBi), 9,10-di(naph-2-tyl)anthracene (ADN), 3-tert-butyl-9,10-di(naphthalen-2-yl)anthracene (TBADN), and the like.

The second electrode 150 is formed on the intermediate layer 140.

Although not shown, an encapsulating member (not shown) may be formed on the second electrode 150. The encapsulating member may be formed of an organic material or an inorganic material.

Operations and advantages of the organic light emitting display apparatus 100 according to the current embodiment will be now briefly described.

When voltage is applied to the first electrode 108 and the second electrode 150, visible light is emitted from the intermediate layer 140 that are electrically connected to the first electrode 108 and the second electrode 150.

The organic light emitting display apparatus 100 includes the buffer film 102 to prevent impurity elements from penetrating into the TFT, the capacitor 110, and the other elements of the organic light emitting display apparatus 100. Also, the buffer film 102 provides a flat surface on the substrate 101 so that the TFT and the like may be formed to have uniform characteristics.

In this case, the first electrode 108 is formed to correspond to the via hole 102a of the buffer film 102. Thus, the gate insulating film 104 is present between the first electrode 108 and the substrate 101, instead of the buffer film 102.

The active layer 103 is formed on the buffer film 102 by using a crystallization process. During the crystallization process, energy is also supplied to the buffer film 102, thus forming protrusions on an upper surface of the buffer film 102. If the first electrode 108 were formed on the buffer film, the protrusions might lower the surface flatness of the first electrode 108 on the buffer film 102, thereby degrading electrical characteristics of the first electrode 108. In particular, protrusions that are similar to the protrusions on the buffer film 102 might be formed on an upper surface of the first electrode 108 to correspond to the protrusions on the buffer film 102, thereby causing a short circuit to occur between the first electrode 108 and the second electrode 150. The short circuit may cause a failure, e.g., a dim spot, to occur, thereby degrading the image quality characteristics of the organic light emitting display apparatus 100.

However, according to the current embodiment, the first electrode 108 is formed to correspond to the via hole 102a of the buffer film 102. Accordingly, it may be possible to help prevent the surface flatness of the first electrode 108 from being degraded due to the buffer film 102. Thus, image quality characteristics of the organic light emitting display apparatus 100 may be easily improved.

Visible light emitted from the intermediate layer 140 has a relatively low directionality. Accordingly, the visible light does not travel only toward a user, i.e., a direction parallel to a direction of measuring the thickness of the substrate 101. In this case, the via hole 102a of the buffer film 102 functions as a reflective wall. The visible light is reflected from side surfaces of the via hole 102a of the buffer film 102 and may thus be effectively transmitted in the direction parallel to the direction of the thickness of the substrate 101. That is, the visible light penetrates through the first electrode 108 and is then effectively transmitted toward the via hole 102a.

Thus, the luminous efficiency of the organic light emitting display apparatus 100 may be increased, thereby improving image quality characteristics thereof. In particular, the via hole 102a may be formed to be larger than the first electrode 108 so as to increase the reflectivity of the visible light on the side surfaces of the via hole 102a.

In particular, if the organic light emitting display apparatus 100 according to the current embodiment is a bottom-emission type organic light emitting display apparatus that transmits visible light toward the substrate 101, then the image quality characteristics thereof may be remarkably improved. In the current embodiment, as illustrated in FIG. 1, the intermediate layer 140 is disposed not to overlap with the TFT. Thus, visible light emitted from the intermediate layer 140 may be easily transmitted toward the substrate 101 without being interrupted by the TFT.

FIGS. 2A to 2D are schematic cross-sectional views sequentially illustrating a method of manufacturing an organic light emitting display apparatus, according to an embodiment.

In particular, FIGS. 2A to 2D illustrate a method of manufacturing the organic light emitting display apparatus 100 of FIG. 1, according to an embodiment.

Figure 2A:
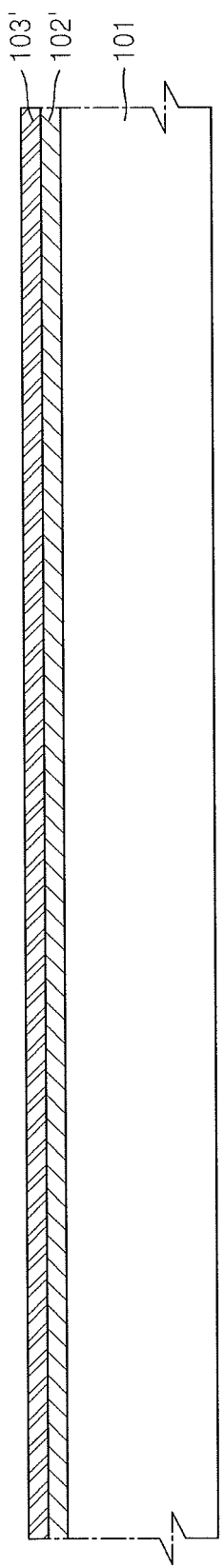
FIGS. 2A to 2D are schematic cross-sectional views depicting stages in a method of manufacturing an organic light emitting display apparatus, according to an embodiment.

First, referring to FIG. 2A, a substrate 101 is prepared. Then, a buffer film material layer 102' is formed on the substrate 101 to form a buffer film 102. Then, an active layer material layer 103' is formed on the buffer film material layer 102' to form an active layer 103.

The buffer film material layer 102' may contain an inorganic material, e.g., a silicon oxide, a silicon nitride, a silicon oxynitride, an aluminum oxide, an aluminum nitride, a titanium oxide, or a titanium nitride; or an organic material, e.g., polyimide, polyester, or acryl The active layer material layer 103' contains silicon. When the active layer material layer 103' is formed of amorphous silicon and the crystallization process is performed on the active layer material layer 103', then the active layer material layer 103' contains polysilicon. During the crystallization process, protrusions (not shown) may be formed on an upper surface of the active layer material layer 103', and protrusions corresponding to the protrusions formed on the upper surface of the active layer material layer 103' may also be formed on an upper surface of the buffer film material layer 102'. In particular, when the active layer material layer 103' is formed according to a laser crystallization process, such protrusions are highly likely to be formed.

Figure 2B:
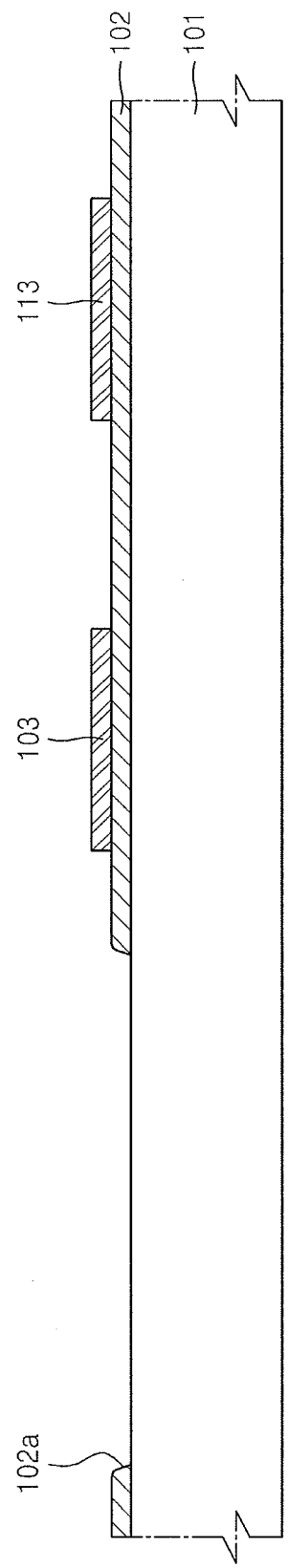

Then, referring to FIG. 2B, a patterning process is performed to form the buffer film 102, the active layer 103, and a first capacitor electrode 113. The patterning process may be performed using one mask. For example, the patterning process may be performed using a halftone mask to simultaneously form the buffer film 102, the active layer 103, and the first capacitor electrode 113.

The buffer film 102 includes a via hole 102a. A region of the substrate 101 is exposed via the via hole 102a. Each of the active layer 103 and the first capacitor electrode 113 is formed on the buffer film 102 in a predetermined pattern.

Figure 2C:
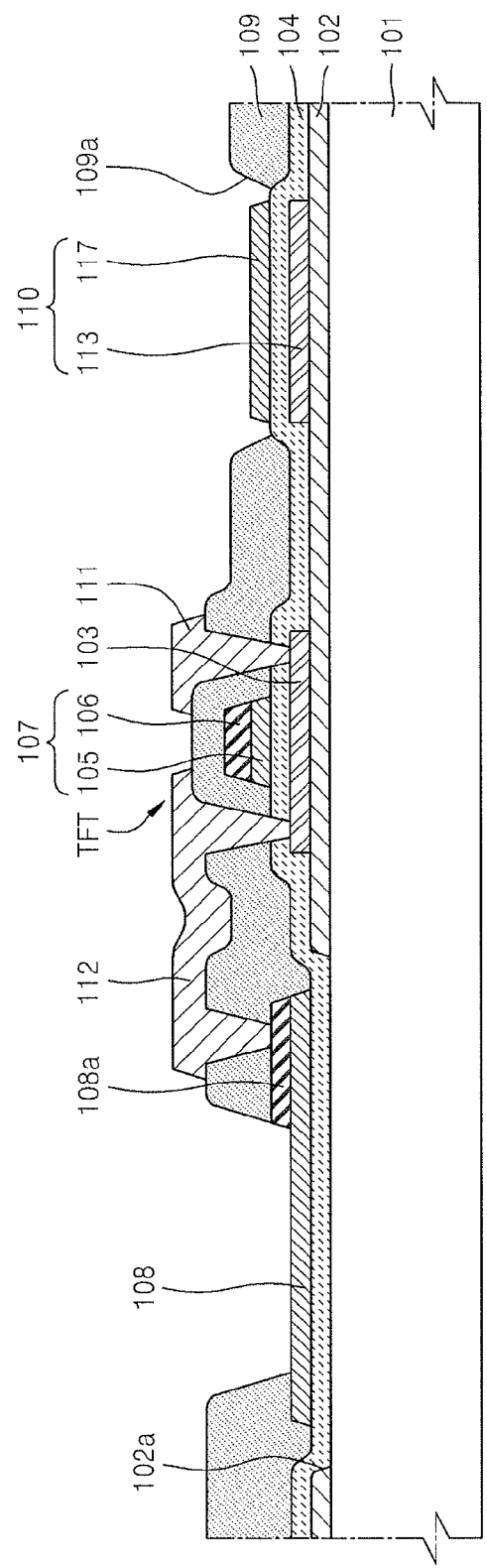

Then, referring to FIG. 2C, a gate insulating film 104 is formed on the buffer film 102 to cover the active layer 103 and the first capacitor electrode 113. In this case, the gate insulating film 104 is disposed to fill the via hole 102a of the buffer film 102.

Then, a gate electrode 107, a first electrode 108, and a second capacitor electrode 117 are formed on the gate insulating film 104.

The gate electrode 107 includes a first conductive layer 105 and a second conductive layer 106. The first electrode 108 may be formed of a material used to form the first conductive layer 105. A conductive portion 108a is disposed on an upper region of the first electrode 108. The conductive portion 108a may be formed of a material used to form the second conductive layer.

The second capacitor electrode 117 may be formed of a material used to form the first conductive layer 105.

Then, an interlayer insulating layer 109 is formed on the first electrode 108, the gate electrode 107, and the second capacitor electrode 117. A source electrode 111 and a drain electrode 112 are formed on the interlayer insulating layer 109. One of the source electrode 111 and the drain electrode 112 is electrically connected to the first electrode 108.

Figure 2D:
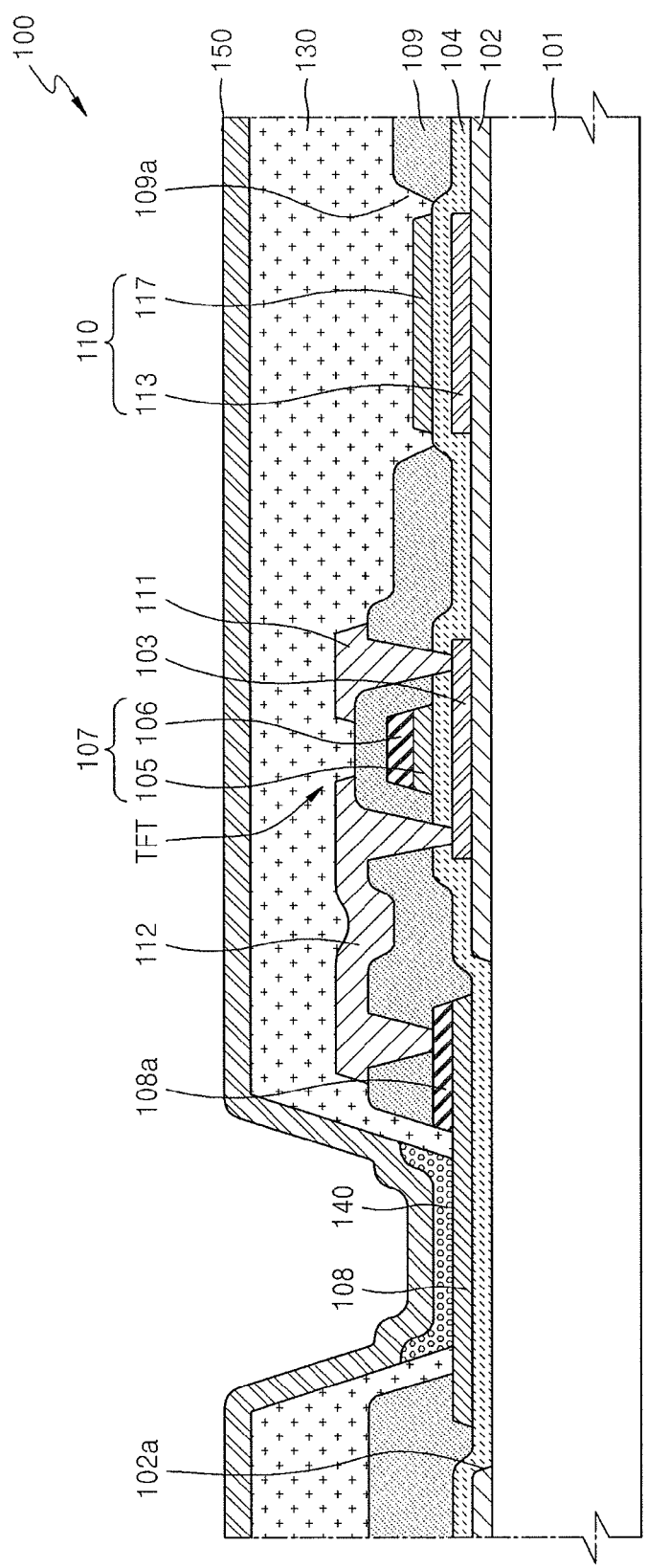

Then, referring to FIG. 2D, a pixel defining film 130 is formed on the interlayer insulating layer 109 to cover the source electrode 111, the drain electrode 112, and the second capacitor electrode 117. The pixel defining film 130 is formed not to cover at least one upper region of the first electrode 108.

Then, an intermediate layer 140 is formed on the first electrode 108. Specifically, the intermediate layer 140 is formed to contact the at least one upper region of the first electrode 108 that is not covered with the pixel defining film 130. The intermediate layer 140 includes an organic emission layer to emit visible light.

A second electrode 150 is formed on the intermediate layer 140.

In the current embodiment, a patterning process may be used with one mask to simultaneously form the buffer film 102, the active layer 103, and the first capacitor electrode 113, thereby simplifying the manufacture of the organic light emitting display apparatus 100.

FIGS. 3A to 3F are schematic cross-sectional views depicting stages of a method of manufacturing the organic light emitting display apparatus 100 of FIG. 1, according to an another embodiment.

Figure 3A:
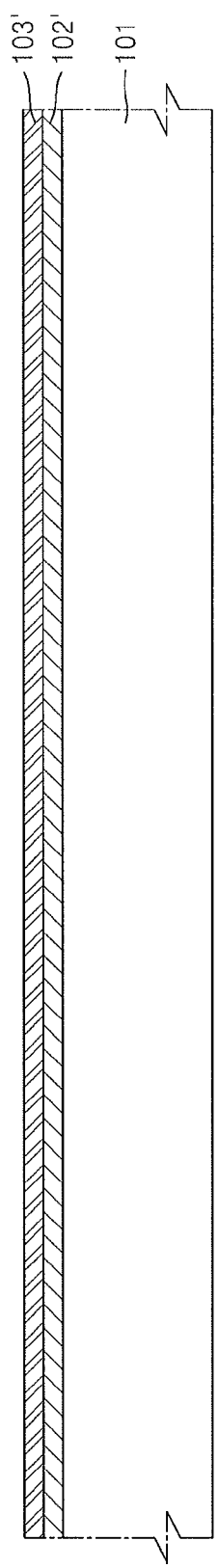
FIGS. 3A to 3F are schematic cross-sectional views depicting stages in a method of manufacturing an organic light emitting display apparatus, according to another embodiment.

First, referring to FIG. 3A, a substrate 101 is prepared. Then, a buffer film material layer 102' is formed on the substrate 101 to form a buffer film 102. Then, an active layer material layer 103' is formed on the buffer film material layer 102' to form an active layer 103.

The buffer film material layer 102' may contain an inorganic material, e.g., a silicon oxide, a silicon nitride, a silicon oxynitride, an aluminum oxide, an aluminum nitride, a titanium oxide, or a titanium nitride; or an organic material, e.g., polyimide, polyester, or acryl The active layer material layer 103' contains silicon. When the active layer material layer 103' is formed of amorphous silicon and the crystallization process is performed on the active layer material layer 103', then the active layer material layer 103' contains polysilicon. During the crystallization process, protrusions (not shown) may be formed on an upper surface of the active layer material layer 103', and protrusions corresponding to the protrusions formed on the upper surface of the active layer material layer 103' may also be formed on an upper surface of the buffer film material layer 102'. In particular, when the active layer material layer 103' is formed according to a laser crystallization process, such protrusions are highly likely to be formed.

Figure 3B:
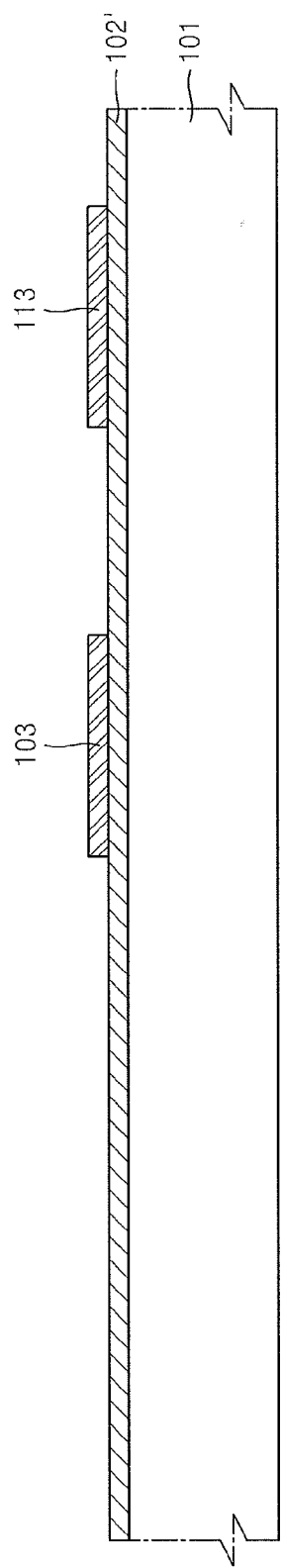

Then, referring to FIG. 3B, a patterning process is performed to form the active layer 103 and a first capacitor electrode 113.

Figure 3C:
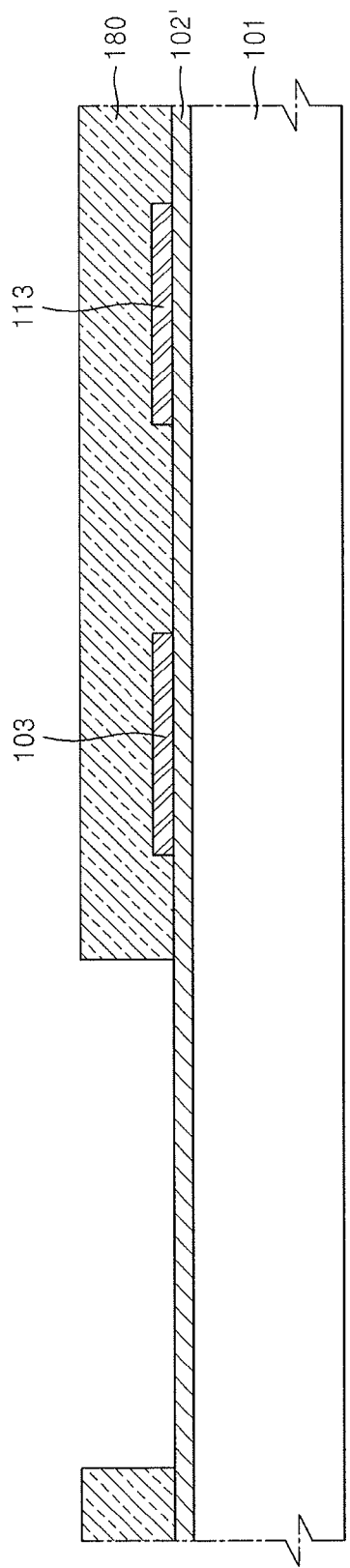
Figure 3D:
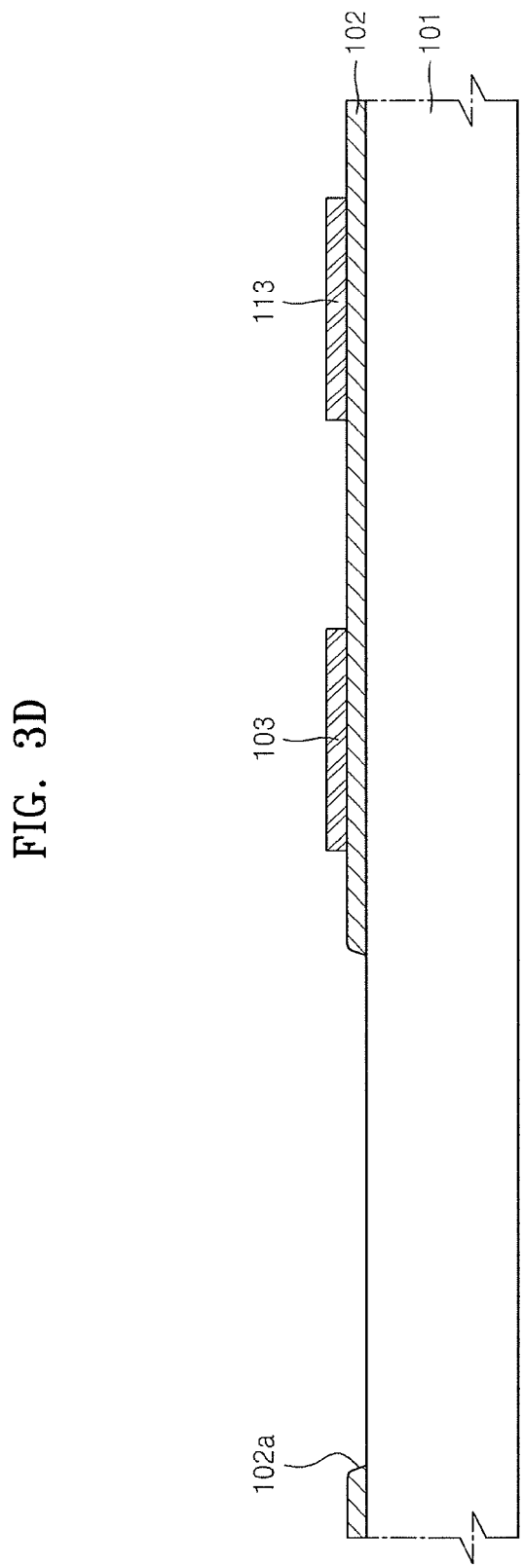

Then, referring to FIGS. 3C and 3D, the buffer film material layer 102' is patterned to form the buffer film 102.

Specifically, referring to FIG. 3C, an etch mask 180 is formed on the resultant structure. The etch mask 180 may be formed of any of various materials, e.g., a photoresist. The etch mask 180 is formed to cover the entire resultant structure, except for a portion of the resultant structure which is to be used as a via hole 102a. In detail, the etch mask 180 is formed to cover the active layer 103 and the first capacitor electrode 113.

Then, referring to FIG. 3D, a portion of the buffer film material layer 102' that is not covered with the etch mask 180 is etched to form the buffer film 102. In detail, the via hole 102a is formed by etching the portion of the buffer film material layer 102'. A region of the substrate 101 is exposed via the via hole 102a. After the etching process is performed, the etch mask 180 is removed according to a strip process.

After the etching process, an ashing process is additionally performed so that the etch mask 180 may be easily completely removed, before the strip process is performed.

Figure 3E:
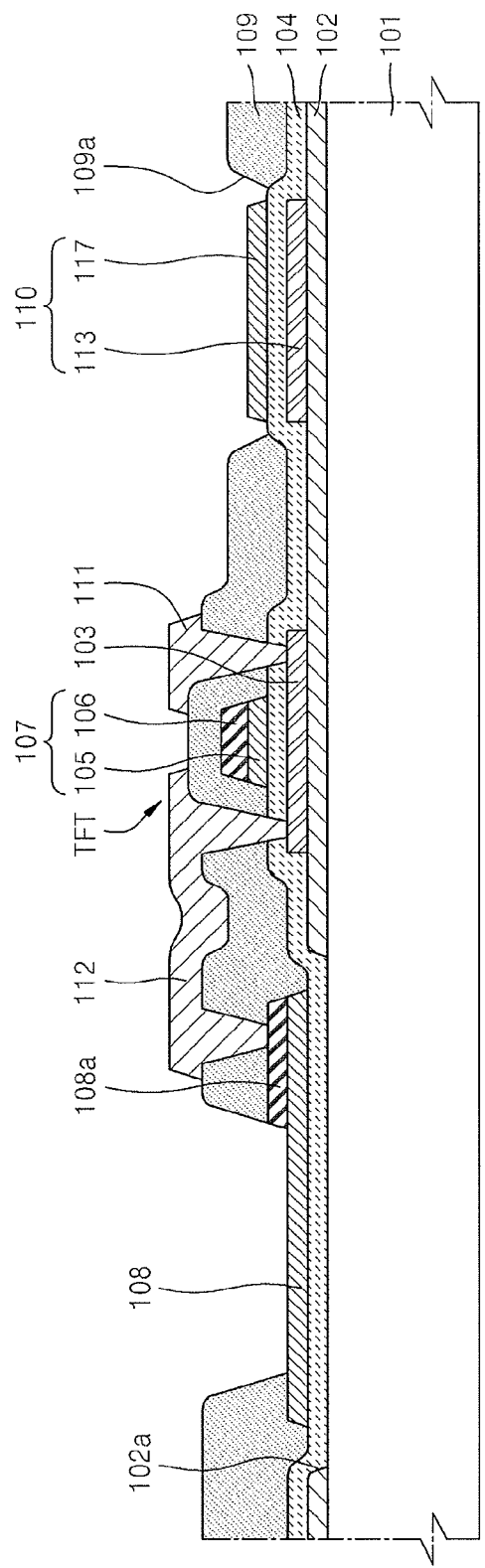

Then, referring to FIG. 3E, a gate insulating film 104 is formed on the buffer film 102 to cover the active layer 103 and the first capacitor electrode 113. The gate insulating film 104 is disposed to fill the via hole 102a of the buffer film 102.

A gate electrode 107, a first electrode 108, and a second capacitor electrode 117 are formed on the gate insulating film 104.

The gate electrode 107 includes a first conductive layer 105 and a second conductive layer 106. The first electrode 108 may be formed of a material used to form the first conductive layer 105. A conductive portion 108a is disposed on a region of first electrode 108. The conductive portion 108a may be formed of a material used to form the second conductive layer 106.

The second capacitor electrode 117 may be formed of a material used to form the first conductive layer 105.

An interlayer insulating layer 109 is formed on the first electrode 108, the gate electrode 107, and the second capacitor electrode 117. Then, a source electrode 111 and a drain electrode 112 are formed on the interlayer insulating layer 109. One of the source electrode 111 and the drain electrode 112 is electrically connected to the first electrode 108.

Figure 3F:
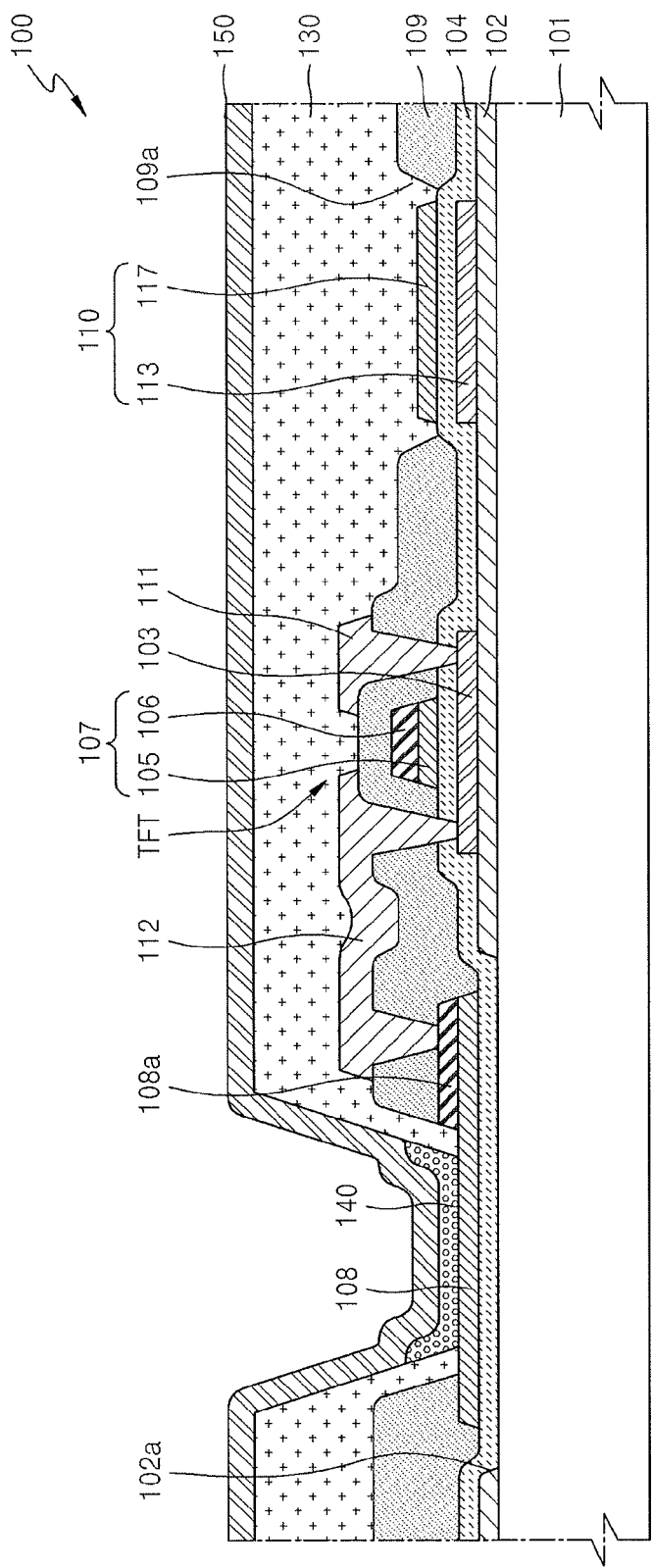

Then, referring to FIG. 3F, a pixel defining film 130 is formed on the interlayer insulating layer 109 to cover the source electrode 111, the drain electrode 112, and the second capacitor electrode 117. The pixel defining film 130 is formed not to cover at least one upper region of the first electrode 108.

Then, an intermediate layer 140 is formed on the first electrode 108. In detail, the intermediate layer 140 is formed to contact the at least one upper region of the first electrode 108 that is not covered with the pixel defining film 130. The intermediate layer 140 includes an organic emission layer to emit visible light.

Then, a second electrode 150 is formed on the intermediate layer 140.

By way of summation and review, if the surface of a first electrode of an organic light emitting display is rough, the electrical characteristics of the organic light emitting display apparatus may be degraded. In particular, when protrusions are present on a top surface of the first electrode, the protrusions may be connected to the intermediate layer and the second electrode, thereby causing an electrical failure, e.g., a short circuit, to occur. Accordingly, there may be limitations to improving image quality characteristics of the organic light emitting display apparatus.

Embodiments may provide an organic light emitting display apparatus that is capable of easily improving image quality and a method of manufacturing the same. Embodiments may include an organic light emitting display apparatus in which a first electrode corresponds to a via hole of a buffer layer.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. An organic light emitting display apparatus, comprising:
   a substrate;
   a buffer film directly on the substrate, the buffer film including a via hole;
   a thin film transistor (TFT) directly on the buffer film, the TFT including an active layer, a gate electrode, a source electrode, and a drain electrode;
   a first electrode on a gate insulating layer on which the gate electrode is disposed and electrically connected to one of the source electrode and the drain electrode and corresponding to the via hole, the via hole in the buffer film directly on the substrate being larger than the first electrode;
   an intermediate layer on the first electrode, the intermediate layer including an organic emission layer; and
   a second electrode on the intermediate layer, wherein
   the gate insulating layer between the gate electrode and the active layer insulating the gate electrode and the active layer from each other,
   a portion of the gate insulating layer disposed between the substrate and the first electrode fills the via hole, and
   the portion of the gate insulating layer directly contacts the substrate and the first electrode.

2. The organic light emitting display apparatus of claim 1, wherein the first electrode contains indium tin oxide (ITO), indium zinc oxide (IZO), zinc oxide (ZnO), indium oxide ($In_2O_3$), indium gallium oxide (IGO), or aluminum zinc oxide (AZO).

3. The organic light emitting display apparatus of claim 1, wherein the first electrode contains at least one material selected from among materials forming the gate electrode.

4. The organic light emitting display apparatus of claim 1, wherein:
   the gate electrode includes a first conductive layer and a second conductive layer, the second conductive layer being on the first conductive layer, the first conductive layer being on the layer, and
   the first electrode including a same material as the first conductive layer.

5. The organic light emitting display apparatus of claim 1, wherein the intermediate layer is spaced apart laterally from the TFT to be in a laterally non-overlapping relationship with the TFT.

6. The organic light emitting display apparatus of claim 1, wherein:
   the first electrode is directly on and only on the layer on which the gate electrode is disposed; and
   the intermediate layer is directly on and only on an uppermost surface of the first electrode.

7. A method of manufacturing an organic light emitting display apparatus, the method comprising:
   forming a buffer film directly on a substrate to include a via hole;
   forming a thin film transistor (TFT) directly on the buffer film, the TFT including an active layer, a gate electrode, a source electrode, and a drain electrode;
   forming a first electrode on a gate insulating layer on which the gate electrode is disposed and to be electrically connected to one of the source electrode and the drain electrode and to correspond to the via hole, the via hole in the buffer film directly on the substrate being larger than the first electrode;
   forming an intermediate layer on the first electrode, the intermediate layer including an organic emission layer; and
   forming a second electrode on the intermediate layer, wherein
   the gate insulating layer between the gate electrode and the active layer insulating the gate electrode and the active layer from each other,
   a portion of the gate insulating layer disposed between the substrate and the first electrode fills the via hole, and
   the portion of the gate insulating layer directly contacts the substrate and the first electrode.

8. The method of claim 7, wherein the forming of the buffer film includes:
   forming a buffer film material layer on the substrate;
   forming the active layer directly on the buffer film material layer;
   forming an etch mask to cover the active layer and to not cover a region in which the via hole is to be formed; and
   forming the via hole by performing an etch process by using the etch mask.

9. The method of claim 7, wherein the forming of the active layer includes at least a crystallization process.

10. The method of claim 7, wherein:
    forming the first electrode on the layer on which the gate electrode is disposed includes forming the first electrode directly on and only on the layer on which the gate electrode is disposed; and
    forming the intermediate layer on the first electrode includes forming the intermediate layer directly on and only on an uppermost surface of the first electrode.

11. An organic light emitting display apparatus, comprising:
    a substrate;
    a buffer film directly on the substrate, the buffer film including a via hole;
    a thin film transistor (TFT) directly on the buffer film, the TFT including an active layer, a gate electrode, a source electrode, and a drain electrode;
    a gate insulating layer, a portion of the gate insulating layer that fills the via hole;
    a first electrode on the gate insulating layer that fills the via hole and electrically connected to one of the source electrode and the drain electrode and corresponding to the via hole, the via hole in the buffer film directly on the substrate being larger than the first electrode;

an intermediate layer on the first electrode, the intermediate layer including an organic emission layer; and a second electrode on the intermediate layer, wherein the gate insulating layer between the gate electrode and the active layer insulating the gate electrode and the active layer from each other, the portion of the gate insulating layer that fills the via hole being between the substrate and the first electrode, and the portion of the gate insulating layer directly contacts the substrate and the first electrode.

12. The organic light emitting display apparatus of claim 11, wherein the first electrode is directly on the layer that fills the via hole, does not overlap the layer directly contacted by and underlying the active layer, and overlaps the active layer in a direction parallel to a direction of measuring a thickness of the substrate.

13. The organic light emitting display apparatus of claim 11, wherein:

the first electrode is directly on and only on the layer on which the gate electrode is disposed; and the intermediate layer is directly on and only on an uppermost surface of the first electrode.

* * * * *